United States Patent
Li et al.

(10) Patent No.: US 9,680,200 B2
(45) Date of Patent: Jun. 13, 2017

(54) TP ON/IN CELL-TYPE THIN-FILM TRANSISTOR DISPLAY DEVICE HAVING INTEGRATED NFC ANTENNA

(71) Applicant: Truly Opto-Electronics Ltd., Guangdong (CN)

(72) Inventors: Jianhua Li, Guangdong (CN); Xuebin Chen, Guangdong (CN)

(73) Assignee: TRULY OPTO-ELECTRONICS LTD., Shanwei, Guangdong (CN)

( * ) Notice: Subject to any disclaimer, the term of this patent is extended or adjusted under 35 U.S.C. 154(b) by 306 days.

(21) Appl. No.: 14/389,317

(22) PCT Filed: Feb. 6, 2013

(86) PCT No.: PCT/CN2013/071439
§ 371 (c)(1),
(2) Date: Sep. 29, 2014

(87) PCT Pub. No.: WO2013/149517
PCT Pub. Date: Oct. 10, 2013

(65) Prior Publication Data
US 2015/0062459 A1    Mar. 5, 2015

(30) Foreign Application Priority Data

Apr. 6, 2012  (CN) .................... 2012 2 0145136 U
Jul. 5, 2012   (CN) .......................... 2012 1 0232613

(51) Int. Cl.
*G02F 1/1335*     (2006.01)
*H01Q 1/22*       (2006.01)
(Continued)

(52) U.S. Cl.
CPC ......... *H01Q 1/2283* (2013.01); *G02F 1/1368* (2013.01); *G02F 1/13306* (2013.01);
(Continued)

(58) Field of Classification Search
CPC ... H01Q 1/2258–1/2275; H01Q 1/2283; G02F 1/13338
See application file for complete search history.

(56) References Cited

U.S. PATENT DOCUMENTS

2010/0001912 A1    1/2010  Pekonen
2010/0182207 A1*   7/2010  Miyata .................... H01L 27/13
                                                    343/702
(Continued)

FOREIGN PATENT DOCUMENTS

CN    101308266 A    11/2008
CN    101682111 A    3/2010
(Continued)

*Primary Examiner* — Mariceli Santiago
(74) *Attorney, Agent, or Firm* — Knobbe Martens Olson & Bear LLP

(57) ABSTRACT

A thin-film transistor displayer integrated with an NFC antenna, is a TP on/in cell thin-film transistor displayer. The NFC antenna is arranged on a display screen of the thin-film transistor displayer, where the NFC interface is built in an output circuit of the display screen and connected to a control mainboard of the display screen. The display screen and NFC antenna features are combined into one, and the NFC antenna is arranged directly on the thin-film transistor displayer, avoiding problems of signal quality deterioration and reception failure due to wearing of the NFC antenna interface and inaccurate alignment. In addition, a solution is provided for facilitating reception of an NFC signal from a display panel and touch panel of the displayer, or for the case that the NFC signal must be received from the display panel and touch panel of the displayer.

18 Claims, 3 Drawing Sheets

(51) Int. Cl.

| | | |
|---|---|---|
| *H01Q 1/44* | (2006.01) | |
| *H01Q 7/00* | (2006.01) | |
| *H01Q 1/40* | (2006.01) | |
| *H01Q 1/50* | (2006.01) | |
| *H05B 33/08* | (2006.01) | |
| *H01L 27/32* | (2006.01) | |
| *H04B 5/00* | (2006.01) | |
| *G02F 1/1333* | (2006.01) | |
| *G02F 1/1368* | (2006.01) | |
| *H05K 1/18* | (2006.01) | |
| *G02F 1/133* | (2006.01) | |
| *G02F 1/167* | (2006.01) | |
| *G09G 3/34* | (2006.01) | |
| *H01L 27/12* | (2006.01) | |

(52) U.S. Cl.

CPC .... *G02F 1/13338* (2013.01); *G02F 1/133345* (2013.01); *G02F 1/133512* (2013.01); *G02F 1/133514* (2013.01); *G02F 1/167* (2013.01); *G09G 3/344* (2013.01); *H01L 27/124* (2013.01); *H01L 27/323* (2013.01); *H01L 27/3225* (2013.01); *H01Q 1/22* (2013.01); *H01Q 1/2258* (2013.01); *H01Q 1/2266* (2013.01); *H01Q 1/40* (2013.01); *H01Q 1/44* (2013.01); *H01Q 1/50* (2013.01); *H01Q 7/00* (2013.01); *H04B 5/0081* (2013.01); *H05B 33/0896* (2013.01); *H05K 1/181* (2013.01); *H05K 1/189* (2013.01); *G09G 2370/00* (2013.01); *H05K 2201/10098* (2013.01); *H05K 2201/10151* (2013.01)

(56) References Cited

U.S. PATENT DOCUMENTS

| | | | | |
|---|---|---|---|---|
| 2012/0133597 | A1* | 5/2012 | Chen | G06F 3/044 |
| | | | | 345/173 |
| 2012/0146857 | A1* | 6/2012 | Wang | H01Q 1/2258 |
| | | | | 343/702 |
| 2013/0187833 | A1* | 7/2013 | Kim | G06F 1/1641 |
| | | | | 345/1.3 |
| 2014/0080411 | A1* | 3/2014 | Konanur | H04B 5/0031 |
| | | | | 455/41.1 |
| 2015/0041786 | A1* | 2/2015 | Li | H01Q 1/44 |
| | | | | 257/40 |

FOREIGN PATENT DOCUMENTS

| | | |
|---|---|---|
| CN | 101930134 A | 12/2010 |
| CN | 102749770 A | 10/2012 |
| TW | 201032206 A1 | 9/2010 |
| WO | 2013/149517 A1 | 10/2013 |

\* cited by examiner

TP ON/IN CELL-TYPE THIN-FILM TRANSISTOR DISPLAY DEVICE HAVING INTEGRATED NFC ANTENNA

This application is the national phase of International Application No. PCT/CN2013/071439 entitled "TP ON/IN CELL-TYPE THIN-FILM TRANSISTOR DISPLAY DEVICE HAVING INTERRATED NFC ANTENNA", filed on Feb. 6, 2013, which claims the priority to Chinese Patent Application 201220145136.8, entitled "DISPLAY SCREEN", filed on Apr. 6, 2012 with the State Intellectual Property Office of People's Republic of China, and Chinese Patent Application 201210232613.9, entitled "TP ON/IN CELL THIN FILM TRANSISTOR DISPLAYER INTEGRATED WITH NFC ANTENNA", filed on Jul. 5, 2012 with the State Intellectual Property Office of People's Republic of China, which are incorporated herein by reference in entirety.

FIELD

The present disclosure relates to the technical field of near field communication, in particular to a thin film transistor displayer integrated with a near field communication (NFC) antenna, and particularly to a touch panel (TP) on/in cell thin film transistor displayer.

BACKGROUND

Near Field Communication (NFC) technology is a necessary technology for electrical products in the future and has a large market. In existing NFC products, the antenna is generally disposed on one side of a battery or adhered in a shell, in a common way of forming a coil with metal wiring on a Printed Circuit Board (PCB) or a Flexible Printed Circuit (FPC) and then adhering the PCB or the FPC, which has the coil, to the battery or the shell. Disadvantage of the existing NFC products mainly is that: with frequent disassembly and assembly of the battery and the shell, wiring of the NFC antenna is prone to wear off or to have a problem of inaccurate alignment, which eventually causes deterioration of antenna signal and affects the function of the NFC products. In addition, the antenna of the NFC product is normally located inside the shell of the electrical product, and in a case of metal shell, signal transmission of the NFC signal may be affected; therefore the choice of strong metal for the shell of the electrical product is limited.

For example, lots of electrical products equipped with a NFC antenna and a thin film transistor displayer (thin film transistor liquid crystal display, TFT-LCD) have above problems. The TFT-LCD, using thin film transistor technology to improve image quality, is an active-matrix LCD and is applied to televisions, panel displayers and projectors. A TFT-LCD panel can be regarded as two glass substrates between which a layer of liquid crystal is sandwiched, a color filter is disposed on the top glass substrate, and transistors are disposed on the bottom glass. When a current passes through the transistor, an electrical field changes, causing deflections of liquid crystal molecules, thereby changing polarization of light; and the bright or dark status of pixels is dependent on a polarizer. In addition, due to combination of the top glass and the color filter, each pixel includes three colors of red, blue and green, and the pixels displaying colors of red, blue and green form an image on the panel.

For the thin film transistor displayer, compared with the original scheme in which the touch panel is disposed on a liquid crystal panel, research on the integration of touch panel function into the liquid crystal panel becomes popular. The integration of the touch panel and the liquid crystal panel may be implemented in In-cell manner and On-cell manner. In the In-cell manner, the touch panel function is embedded in the liquid crystal pixels, and one embodiment is to integrate a TFT array layer with a TP sensor layer; in the On-cell manner, the touch panel function is provided between the color filter substrate and the polarizer, and the TFT array layer is separated from the TP sensor layer. The On-cell manner becomes a popular trend nowadays.

In the unreasonable way of disposing a NFC antenna for an electrical product, which is equipped with the NFC antenna and a thin film transistor displayer, wiring of the NFC antenna is prone to wear off or to have an inaccurate alignment, which may cause deterioration of signal quality and may limit the choice for a shell of the electrical product. Since the integration of the NFC antenna is allowable in the process of producing the thin film transistor displayer, it is desirable to design a new thin film transistor displayer integrated with a NFC antenna to solve above problems.

SUMMARY

In view of this, the disclosure is to provide a thin film transistor displayer integrated with a NFC antenna, which may prevent wiring of the antenna from wearing off or inaccurate alignment and is beneficial to ensure quality of antenna signal. In addition, for an electrical product equipped with the thin film transistor displayer, signal is transferred through a facade of the displayer, and material of a shell is not limited due to the NFC antenna.

To solve above technical problems, a technical solution is provided in the disclosure as follows. A thin film transistor displayer integrated with a NFC antenna is a TP on-cell or in-cell thin film transistor displayer, the NFC antenna is disposed on a display screen of the thin film transistor displayer, of which a NFC interface is built in an output circuit of the display screen and is connected to a control mainboard of the display screen.

Preferably, the thin film transistor displayer is a TP on cell thin film transistor displayer, the display screen includes a top substrate, a touch sensor layer, a color filter layer, a transparent conductive layer, a liquid crystal layer, a TFT array and a bottom substrate sequentially, and the NFC antenna is connected to the TFT array.

Preferably, the NFC antenna is disposed on an inner surface of the top substrate and is led to an output circuit of the display screen through conductive material to output signals to a control mainboard of the display screen.

Preferably, a Black Matrix layer is printed at circumference of the inner surface of the top substrate, and the NFC antenna is disposed on an area of the Black Matrix layer.

Preferably, the NFC antenna is disposed on an outer surface of the top substrate, is covered by an insulation protection layer, and is led to the output circuit of the display screen through conductive material to output signals to the control mainboard of the display screen.

Preferably, the thin film transistor displayer is a TP on cell thin film transistor displayer, the display screen includes a top substrate, a color filter layer, a transparent conductive layer, a liquid crystal layer, a TFT array, a touch sensor layer and a bottom substrate sequentially, and the NFC antenna is connected to the TFT array.

The NFC antenna is disposed on an outer surface of the bottom substrate, is covered by an insulation protection layer, and is led to the output circuit of the display screen through conductive material to output signals to the control mainboard of the display screen.

Preferably, the thin film transistor displayer is a TP in cell thin film transistor displayer, the display screen includes a top substrate, a color filter layer, a transparent conductive layer, a liquid crystal layer, a TFT array integrated with a touch sensor layer, and a bottom substrate sequentially, and the NFC antenna is connected to the TFT array.

Preferably, the NFC antenna is disposed between the bottom substrate and the TFT array integrated with the touch sensor layer, is located at circumference of the TFT array and is led to the output circuit of the display screen through conductive material to output signals to the control mainboard of the display screen.

Preferably, the NFC antenna is in a form of a multi-turn coil made from conductive material wiring.

Preferably, the NFC antenna is made from low-resistance wiring including silver, copper or aluminum.

Preferably, the NFC antenna is wound in an annular shape matching with the outer contour of product.

Preferably, the multi-turn coil is wound in a rectangle or circle shape.

Preferably, a side of the multi-turn coil, which is closer to inner part of the thin film transistor displayer, is covered by a layer of transparent ferrite material.

Compared to conventional technology, in a thin film transistor displayer integrated with a NFC antenna according to the disclosure, the NFC antenna is directly disposed on the thin film transistor displayer. The NFC interface is built in an output circuit of the display screen and is connected to a control mainboard, therefore the NFC interface is fixed after assembly and is not frequently assembled and disassembled, and conventional problems such as signal quality deterioration and reception failure due to wearing off and inaccurate alignment of the NFC antenna interface are avoided. In addition, a solution is provided for facilitating reception of NFC signal from a display plane of the displayer or for application to the case that the NFC signal must be received from the display plane of the displayer. In addition, a solution is provided for facilitating reception of NFC signal from a display panel and a touch panel of the display device, or for application to the case that the NFC signal must be received from the display panel and the touch panel of the display device. In addition, for an electrical product equipped with the thin film transistor displayer, signal is transferred through facade of the displayer, and material of a shell is not limited due to the NFC antenna.

BRIEF DESCRIPTION OF THE DRAWINGS

In FIGS. 1a~4:

1, top substrate; 2, Black Matrix layer; 3, NFC antenna; 4, touch sensor layer; 5, color filter layer; 6, ITO layer; 7, liquid crystal layer; 8, TFT array; 9, bottom substrate; 10, conductive silver paste; 11, insulation protection layer.

DETAILED DESCRIPTION

The basic idea of the disclosure is that a NFC antenna is disposed on a display screen of a thin film transistor displayer, of which a NFC interface is built in an output circuit of the display screen and is connected to a control mainboard of the display screen.

For better understanding of the technical solutions of the present disclosure by those skilled in the art, the technical solutions according to embodiments of the disclosure are described clearly and completely in the following in conjunction with the appended drawings.

In the following embodiments, FIGS. 1a~3 represent a TP on cell thin film transistor displayer, in which a TFT Array layer and a TP Sensor layer are separated; FIG. 4 represent a TP in cell thin film transistor displayer, in which a TFT Array layer and a TP Sensor layer are integrated together; the embodiments are described respectively as follows.

Figure 1A:
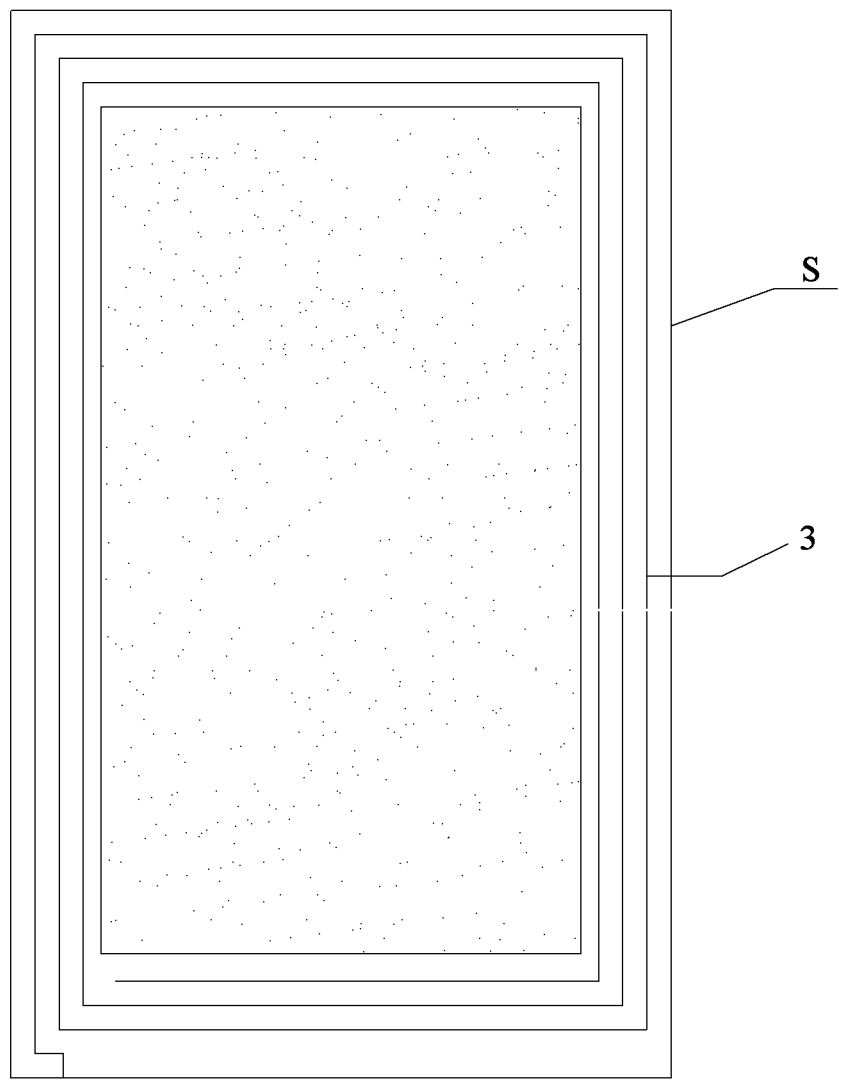
FIG. 1a is a front view showing assembling position for a NFC antenna on a display screen in a thin film transistor displayer integrated with the NFC antenna according to embodiment 1 of the disclosure.
Figure 1B:
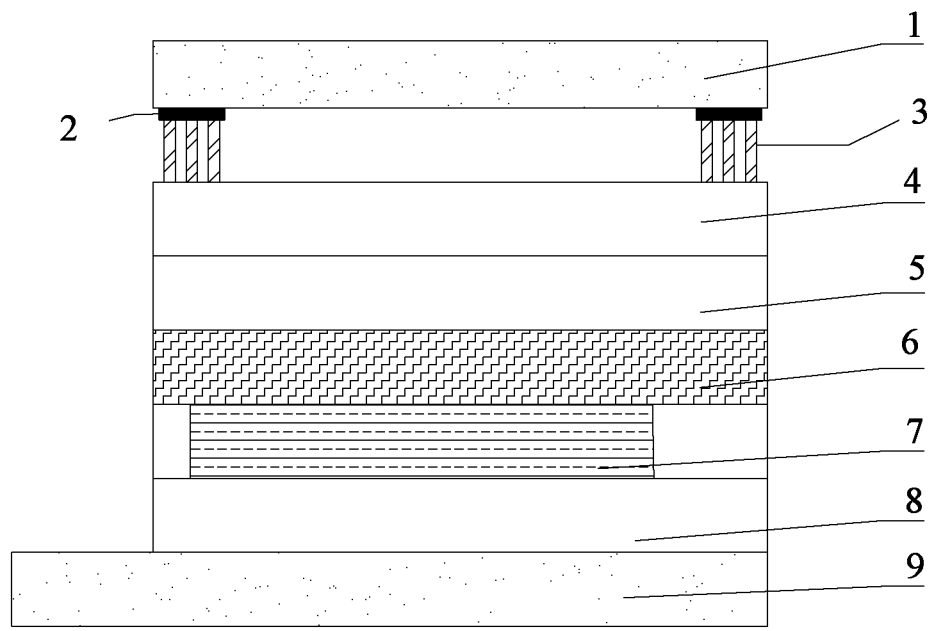
FIG. 1b is a structural schematic diagram of the thin film transistor displayer integrated with a NFC antenna according to embodiment 1 of the disclosure.

FIG. 1a and FIG. 1b represent an assembling structure of a NFC antenna in a thin film transistor displayer integrated with the NFC antenna according to embodiment 1 of the disclosure. A display screen S of the thin film transistor displayer integrated with a NFC antenna, which is a multi-touch capacitive screen or a multi-touch resistive screen, sequentially includes a top substrate 1, a touch sensor layer (TP Sensor) 4, a color filter layer (Color Filter) 5, an Indium Tin Oxide (ITO) layer (or other transparent conductive layer) 6, a liquid crystal layer 7, a TFT array 8 and a bottom substrate 9 from top to bottom, where a Black Matrix layer 2 is printed at circumference of an inner surface of the top substrate 1, the NFC antenna 3 is disposed on an area of the Black Matrix layer, and the NFC antenna 3 is connected to the TFT array 8.

A specific position of the NFC antenna 3 is shown in FIG. 1b. The NFC antenna 3 is disposed between the top substrate 1 and the touch sensor layer 4. Specifically, the NFC antenna is disposed on the inner surface of the top substrate 1 and is led to an output circuit of the display screen through conductive material to output signals to a control mainboard of the display screen. The NFC antenna 3 is in a form of a multi-turn coil made from metal (silver, copper, aluminum) wiring or other low-resistance wiring, and specifically, the multi-turn coil is wound in a rectangle or circle shape or other annular shape matching with outer contour of the displayer product; a side of the multi-turn coil, which is closer to inner part of the thin film transistor displayer, is provided with (covered by) a layer of transparent ferrite material to enhance magnetic field induction intensity. Such wiring may be implemented by using existing equipment, and will not incur new investment.

Embodiment 2

Figure 2:
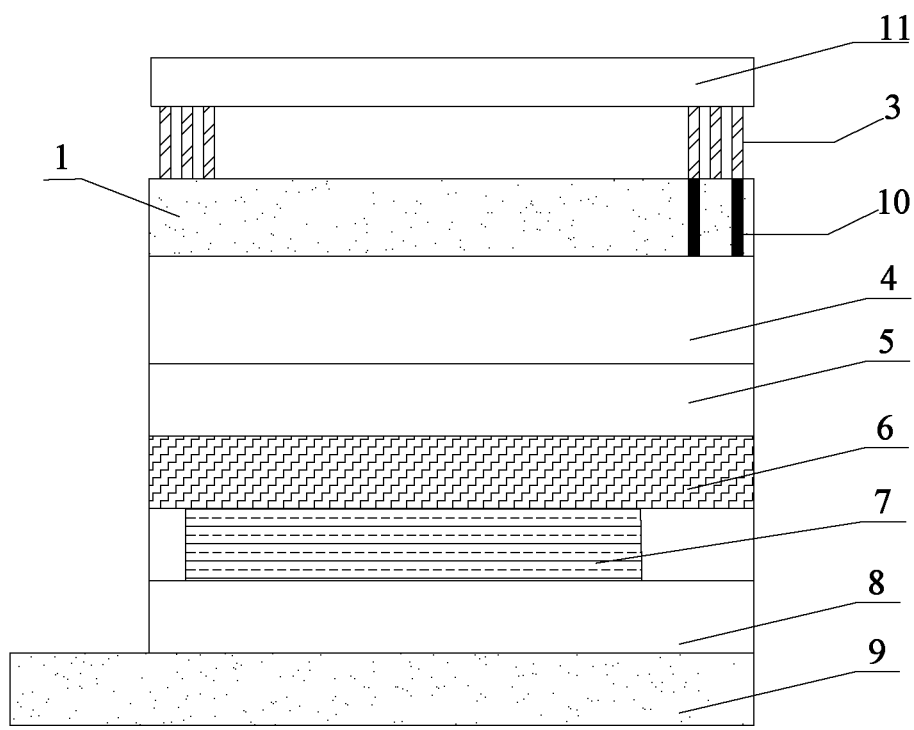
FIG. 2 is a structural schematic diagram of a thin film transistor displayer integrated with a NFC antenna according to embodiment 2 of the disclosure.

FIG. 2 is a structural schematic diagram of a thin film transistor displayer integrated with a NFC antenna according to embodiment 2 of the disclosure. The thin film transistor displayer is a TP on cell thin film transistor displayer as well, where the NFC antenna 3 is disposed on an outer surface of the top substrate 1, is covered by an insulation protection layer 11 and is led to an output circuit of the display screen through conductive silver paste 10 or other conductive material to output signals to a control mainboard of the display screen. Other structures are the same as those according to embodiment 1 and are not described.

Embodiment 3

Figure 3:
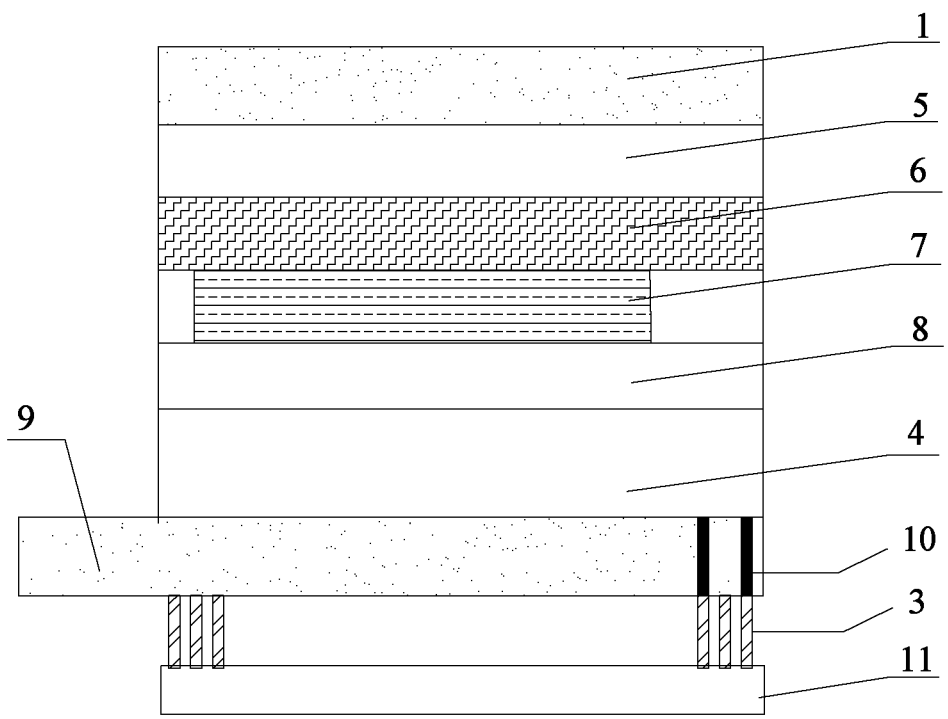
FIG. 3 is a structural schematic diagram of a thin film transistor displayer integrated with a NFC antenna according to embodiment 3 of the disclosure.
Figure 4:
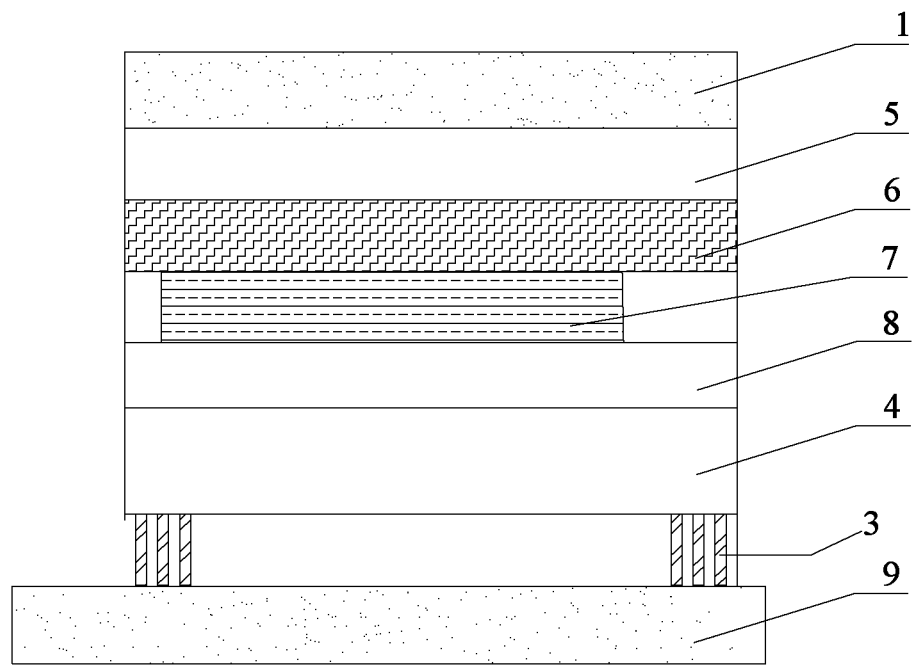
FIG. 4 is a structural schematic diagram of a thin film transistor displayer integrated with a NFC antenna according to embodiment 4 of the disclosure.

FIG. 3 is a structural schematic diagram of a thin film transistor displayer integrated with a NFC antenna according to embodiment 3 of the disclosure. In the embodiment, the thin film transistor displayer is a TP on cell thin film transistor displayer. A display screen of the TP on cell thin film transistor displayer includes a top substrate 1, a color filter layer 5, an ITO layer 6, a liquid crystal layer 7, a TFT array 8, a touch sensor layer 4 and a bottom substrate 9 sequentially, and the NFC antenna 3 is connected to the TFT array 8. The NFC antenna 3 is disposed on an outer surface of the bottom substrate 9, is covered by an insulation protection layer 11, and is led to an output circuit of the display screen through conductive silver paste 10 or other conductive material to output signals to a control mainboard of the display screen. Other structures are the same as those according to embodiment 1 and embodiment 2 and are not described.

Embodiment 4

FIG. 4 is a structural schematic diagram of a thin film transistor displayer integrated with a NFC antenna according to embodiment 4 of the disclosure. In the embodiment, the thin film transistor displayer is a TP in cell thin film transistor displayer. A display screen of the TP in cell thin film transistor displayer includes a top substrate 1, a color filter layer 5, an ITO layer 6, a liquid crystal layer 7, a TFT array 8 integrated with a touch sensor layer 4, and a bottom substrate 9 sequentially, and the NFC antenna 3 is connected to the TFT array 8. The NFC antenna 3 is disposed between the bottom substrate 9 and the TFT array integrated with a touch sensor layer 4, is located at circumference of the TFT array 8 and is led to an output circuit of the display screen through conductive material to output signals to a control mainboard of the display screen. Other structures are the same as those according to embodiment 3 and are not described.

In addition, antenna matching circuits (not shown), electrically connected to the NFC antenna 3, are provided for the above embodiments. The antenna matching circuit includes a charge-discharge module and an impedance module connected to the charge-discharge module, where the charge-discharge module includes capacitors connected in series or in parallel, and the impedance module includes resistors connected in series or in parallel. Therefore, power matching of the NFC antenna 3 is implemented through the antenna matching circuit.

According to above embodiments of the disclosure, the NFC antenna 3 is directly disposed on the thin film transistor displayer. The NFC interface is built in an output circuit of the display screen and is connected to a control mainboard (not shown), therefore the NFC interface is fixed after assembly and is not frequently assembled and disassembled, and signal reception failure due to wearing off and inaccurate alignment of the NFC antenna interface is avoided. In addition, a solution is provided for facilitating reception of NFC signal from a display plane and a touch plane of the displayer or for application to the case that the NFC signal must be received from the display plane and the touch plane of the displayer. In addition, for an electrical product equipped with the thin film transistor displayer, signal is transferred through facade of the displayer, and material of a shell is not limited due to the NFC antenna.

The thin film transistor displayer integrated with a NFC antenna according to the disclosure, for which functions of a display screen and a NFC antenna are combined, is more competitive in the market.

Preferred embodiments of the disclosure are set forth above. It should be noted that the preferred embodiments should not be seen as a limitation to the disclosure, and scope of the disclosure should be subjected to the appended claims. Some modifications and improvements may be made by those skilled in the art within the spirit and scope of the disclosure and these modifications and improvements fall in the scope of the disclosure.

What is claimed is:

1. A thin film transistor displayer integrated with a near field communication NFC antenna, wherein the thin film transistor displayer is a touch panel on-cell thin film transistor displayer, the NFC antenna is disposed on a display screen of the thin film transistor displayer, a NFC interface is built in an output circuit of the display screen and is connected to a control mainboard of the display screen, the display screen comprises a top substrate, a touch sensor layer, a color filter layer, a transparent conductive layer, a liquid crystal layer, a TFT array and a bottom substrate sequentially, and the NFC antenna is connected to the TFT array.

2. The thin film transistor displayer integrated with a NFC antenna according to claim 1, wherein the NFC antenna is disposed between the top substrate and the touch sensor layer, and is led to the output circuit of the display screen through conductive material to output signals to the control mainboard of the display screen.

3. The thin film transistor displayer integrated with a NFC antenna according to claim 2, wherein a Black Matrix layer is printed at circumference of an inner surface of the top substrate, and the NFC antenna is disposed on an area of the Black Matrix layer.

4. The thin film transistor displayer integrated with a NFC antenna according to claim 1, wherein the NFC antenna is disposed on an outer surface of the top substrate, is covered by an insulation protection layer, and is led to the output circuit of the display screen through conductive material to output signals to the control mainboard of the display screen.

5. The thin film transistor displayer integrated with a NFC antenna according to claim 1, wherein the NFC antenna is in a form of a multi-turn coil made from conductive material wiring.

6. The thin film transistor displayer integrated with a NFC antenna according to claim 5, wherein the multi-turn coil is wound in an annular shape matching with the outer contour of product.

7. The thin film transistor displayer integrated with a NFC antenna according to claim 6, wherein a side of the multi-turn coil which is closer to inner part of the displayer is covered by a layer of transparent ferrite material.

8. The thin film transistor displayer integrated with a NFC antenna according to claim 6, wherein the NFC antenna is made from low-resistance wiring comprising silver, copper or aluminum.

9. The thin film transistor displayer integrated with a NFC antenna according to claim 6, wherein the multi-turn coil is wound in a rectangle or circle shape.

10. The thin film transistor displayer integrated with a NFC antenna according to claim 5, wherein a side of the multi-turn coil which is closer to inner part of the displayer is covered by a layer of transparent ferrite material.

11. The thin film transistor displayer integrated with a NFC antenna according to claim 5, wherein the NFC antenna is made from low-resistance wiring comprising silver, copper or aluminum.

12. The thin film transistor displayer integrated with a NFC antenna according to claim 5, wherein the multi-turn coil is wound in a rectangle or circle shape.

13. A thin film transistor displayer integrated with a near field communication NFC antenna, wherein the thin film transistor displayer is a touch panel on-cell thin film transistor displayer, the NFC antenna is disposed on a display screen of the thin film transistor displayer, a NFC interface is built in an output circuit of the display screen and is connected to a control mainboard of the display screen, the display screen comprises a top substrate, a color filter layer, a transparent conductive layer, a liquid crystal layer, a TFT array, a touch sensor layer and a bottom substrate sequentially, and the NFC antenna is connected to the TFT array.

14. The thin film transistor displayer integrated with a NFC antenna according to claim 13, wherein the NFC antenna is disposed between the bottom substrate and the touch sensor layer, and is led to the output circuit of the display screen through conductive material to output signals to the control mainboard of the display screen.

15. The thin film transistor displayer integrated with a NFC antenna according to claim 13, wherein the NFC antenna is disposed on an outer surface of the bottom substrate, is covered by an insulation protection layer, and is led to the output circuit of the display screen through conductive material to output signals to the control mainboard of the display screen.

16. A thin film transistor displayer integrated with a near field communication NFC antenna, wherein the thin film transistor displayer is a touch panel in-cell thin film transistor displayer, the NFC antenna is disposed on a display screen of the thin film transistor displayer, a NFC interface is built in an output circuit of the display screen and is connected to a control mainboard of the display screen, the display screen comprises a top substrate, a color filter layer, a transparent conductive layer, a liquid crystal layer, a TFT array integrated with a touch sensor layer, and a bottom substrate sequentially, and the NFC antenna is connected to the TFT array.

17. The thin film transistor displayer integrated with a NFC antenna according to claim 16, wherein the NFC antenna is disposed between the bottom substrate and the TFT array integrated with the touch sensor layer, is located at circumference of the TFT array, and is led to the output circuit of the display screen through conductive material to output signals to the control mainboard.

18. The thin film transistor displayer integrated with a NFC antenna according to claim 16, wherein the NFC antenna is disposed on an outer surface of the bottom substrate, is covered by an insulation protection layer, and is led to the output circuit of the display screen through conductive material to output signals to the control mainboard of the display screen.

\* \* \* \* \*